(12) United States Patent
Park et al.

(10) Patent No.: US 7,318,947 B1
(45) Date of Patent: Jan. 15, 2008

(54) METHOD AND APPARATUS FOR CONTROLLING MAGNETOSTRICTION IN A SPIN VALVE SENSOR

(75) Inventors: Chang-Man Park, Mountain View, CA (US); Shin Funada, Pleasanton, CA (US); Amritpal S. Rana, Union City, CA (US); Daniel E. Scott, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 395 days.

(21) Appl. No.: 10/931,622

(22) Filed: Aug. 31, 2004

(51) Int. Cl.
*B05D 5/12* (2006.01)

(52) U.S. Cl. ............... 427/127; 427/128; 427/131; 29/603.27

(58) Field of Classification Search ........... 427/127, 427/128, 131; 29/603.27
See application file for complete search history.

(56) References Cited

U.S. PATENT DOCUMENTS

| | | | |
|---|---|---|---|
| 5,632,298 A | 5/1997 | Artinian | |
| 5,953,591 A | 9/1999 | Ishihara et al. | |
| 6,641,703 B2 | 11/2003 | Nomura et al. | |
| 6,652,906 B1 * | 11/2003 | Pinarbasi | ................ 427/130 |
| 6,682,630 B1 | 1/2004 | Colpo et al. | |
| 6,755,935 B2 | 6/2004 | Kazumi et al. | |
| 6,853,520 B2 * | 2/2005 | Fukuzawa et al. | ....... 360/324.1 |
| 7,038,891 B2 * | 5/2006 | Choe | ................ 360/324.12 |
| 2002/0064595 A1 | 5/2002 | Nomura et al. | |
| 2002/0086182 A1 | 7/2002 | Fujikata et al. | |
| 2003/0059648 A1 | 3/2003 | Akimoto et al. | |
| 2004/0092119 A1 | 5/2004 | Min et al. | |
| 2004/0094412 A1 | 5/2004 | Navala et al. | |
| 2007/0081276 A1 * | 4/2007 | Fukuzawa et al. | ......... 360/313 |

* cited by examiner

*Primary Examiner*—Alain L. Bashore
(74) *Attorney, Agent, or Firm*—Strategic Patent Group (57) ABSTRACT

A method and system for providing a magnetic element are described. The method and system include providing a pinned layer, fabricating a metallic spacer layer and oxidizing a portion of the spacer layer in an environment including at least oxygen and a gas inert with respect to the spacer layer to provide an oxide layer. The method and system also include creating a free layer. The oxide layer is between a remaining metallic portion of the spacer layer and the free layer. In one aspect, the system includes a chamber and a gas diffusion apparatus within the chamber. The gas diffusion apparatus includes a plurality of nozzles and defines a plane. The gas exits each of the plurality of nozzles in a cone having an apex angle. The nozzles are directed at a nozzle tilt angle of at least half of the apex angle from the plane and the spacer layer.

15 Claims, 9 Drawing Sheets

METHOD AND APPARATUS FOR CONTROLLING MAGNETOSTRICTION IN A SPIN VALVE SENSOR

FIELD OF THE INVENTION

The present invention relates to magnetic recording technology, and more particularly to a method and system for providing a spin valve sensor that has improved magnetostriction.

BACKGROUND OF THE INVENTION

Figure 1:
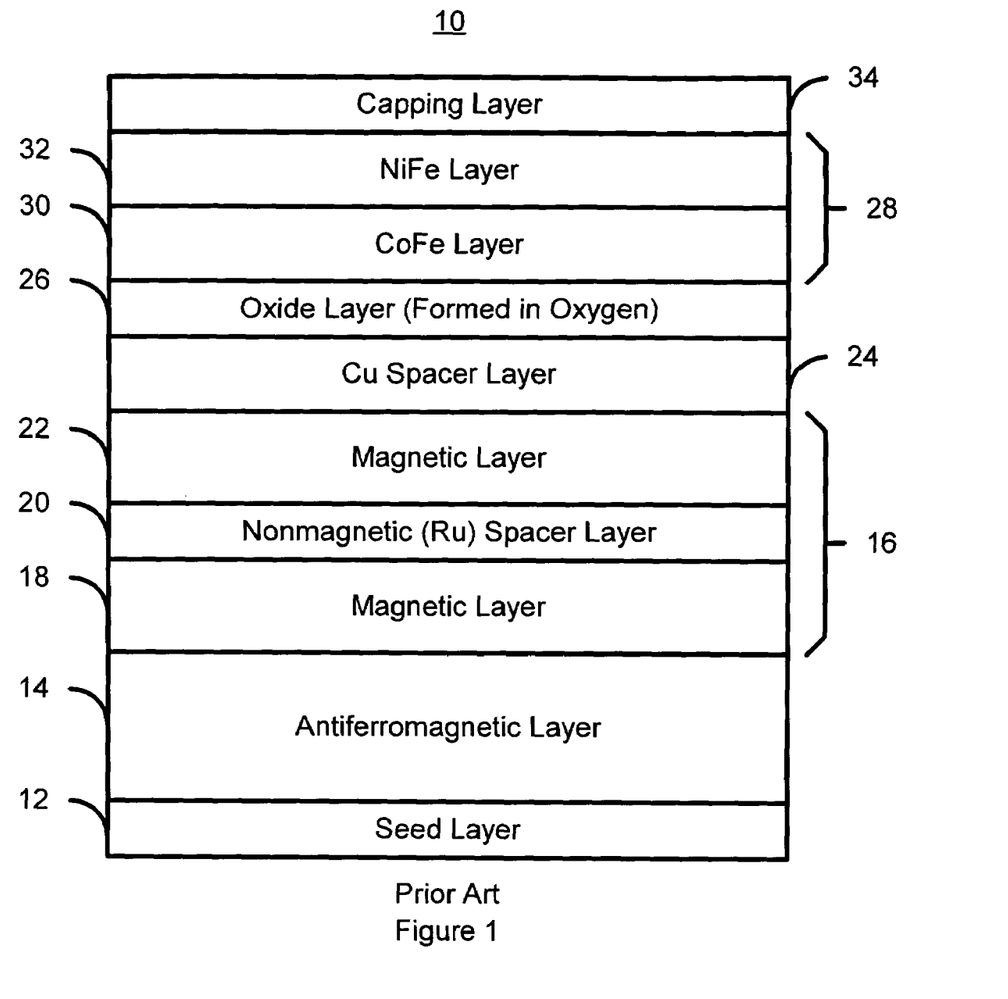
FIG. 1 is a diagram of a conventional magnetic element.

FIG. 1 depicts a conventional magnetic element 10, typically termed a spin valve, that exhibits giant magnetoresistance. The conventional magnetic element 10 includes a seed layer 12, an antiferromagnetic (AFM) layer 14, a pinned layer 16, a conventional spacer layer 24, a conventional oxide layer 26, a pinned layer 28, and a capping layer 34. The pinned layer 16 is a synthetic pinned layer including two ferromagnetic layers 18 and 22 separated by a nonmagnetic conductive spacer layer 20 that is typically Ru. The conventional oxide layer 26 is an oxide of Cu, formed as described below. The conventional free layer 28 includes a bilayer having a CoFe layer 30 and a NiFe layer 32.

Figure 2:
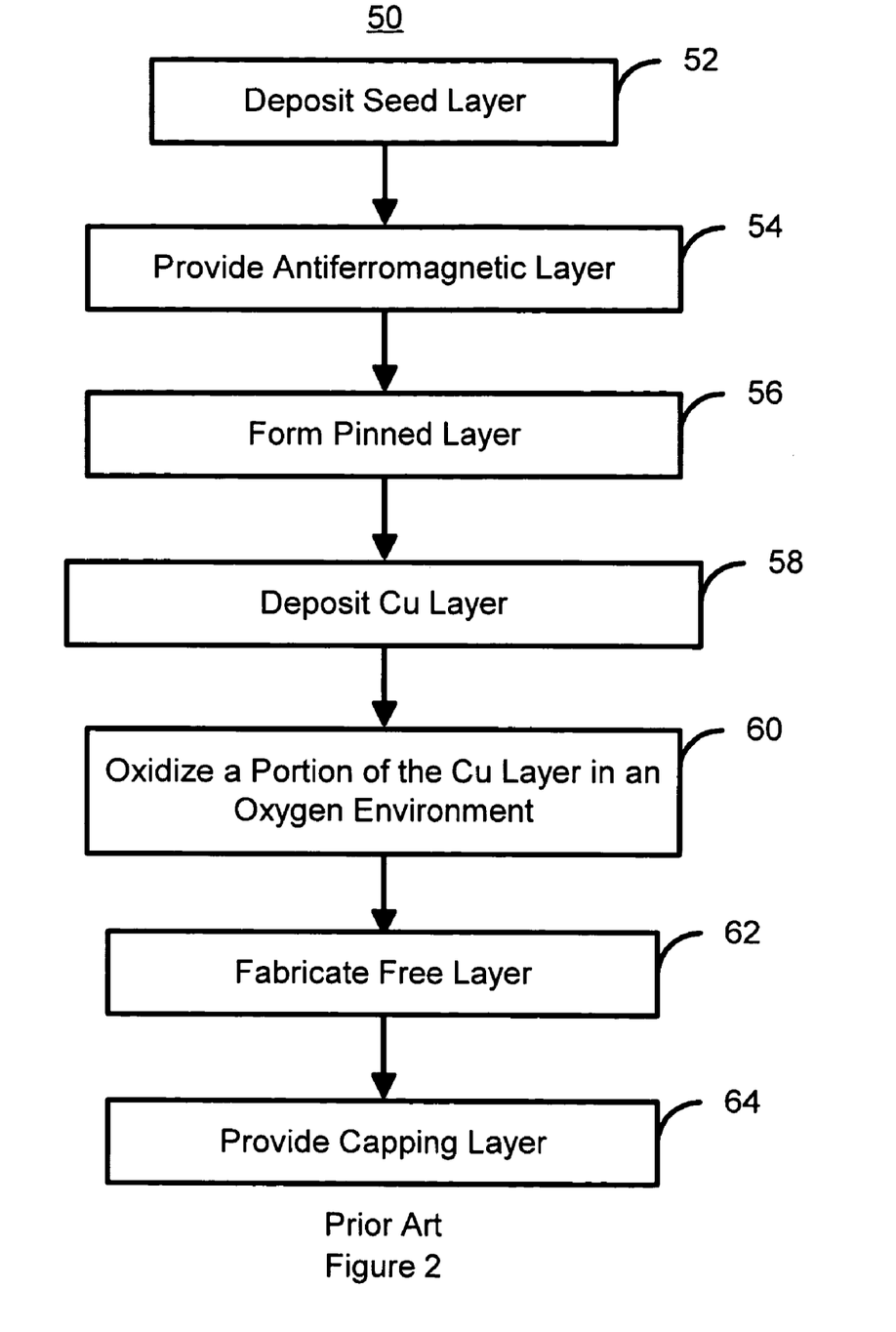
FIG. 2 is a flow chart depicting a conventional method for fabricating a conventional magnetic element.
Figure 3:
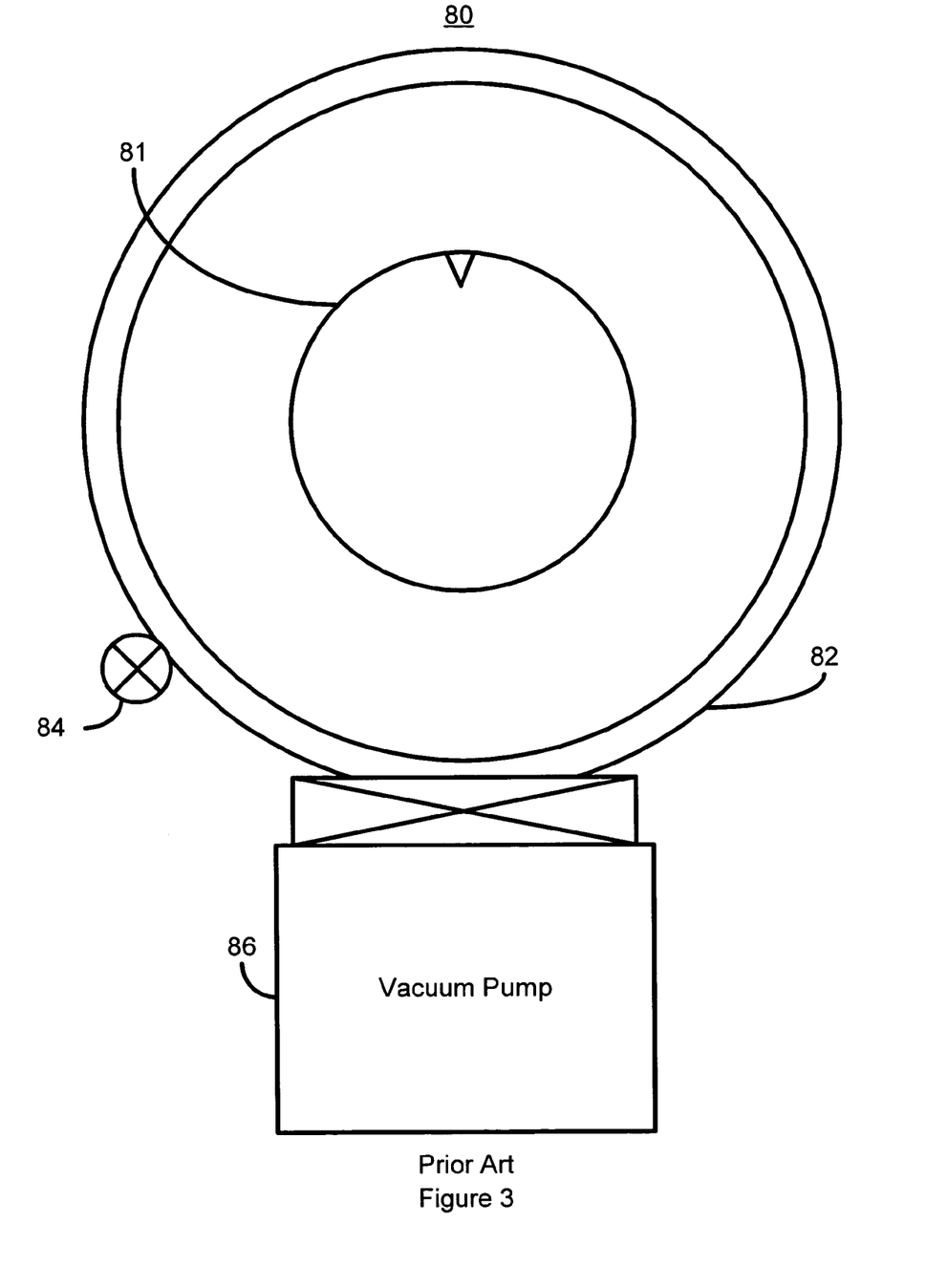
FIG. 3 is a high level diagram of a conventional system for fabricating a conventional magnetic element.

FIG. 2 depicts a conventional method 50 for providing the conventional magnetoresistive element 10. FIG. 3 depicts a conventional system 80 for performing at least a portion of the method 50. The system 80 includes a chamber 82, a gas inlet 84 and a pump 86. Also depicted is a wafer 81 on which multiple conventional magnetic elements 10 are fabricated. Referring to FIGS. 2 and 3, the seed layer 12 and AFM layer 14 are provided on the wafer 81, via step 52 and 54, respectively. The pinned layer 16 is formed, via step 56. Step 56 typically includes depositing the ferromagnetic layers 18 and 22 as well as the conductive spacer layer 20. The Cu spacer layer 24 and the conventional oxide layer 26 are fabricated by depositing Cu in step 58 and oxidizing a portion of the Cu in an oxygen atmosphere, via step 60. During the oxidation step 60, oxygen gas is let into the chamber 82 via the gas inlet 84. The flow rate of oxygen gas into the chamber 82 in step 60 is not closely controlled. As a result of the oxidation in step 60, the conventional oxide layer 26 is formed. The free layer 28 is fabricated in step 62. The capping layer 34 is provided, via step 64.

Use of the conventional free layer 28 including a CoFe layer 30 and a NiFe layer 32 allows the conventional magnetic element 10 to have a soft magnetic response and improved signal amplitude, which are desirable for magnetic recording applications. This conventional oxide layer 26 is used also to improve the output amplitude for the conventional magnetic element 10. As a result, the conventional magnetic element 10 may be used in device applications.

Although the method 50 and system 80 are used to configure the magnetic element 10 to have certain properties that are desirable for devices, the magnetic element 10 is subject to serious drawbacks. In particular, the magnetic element 10 may be subject to magnetostriction. Use of the conventional oxidation in step 60 may result in an unstable Fe-oxide phase in the free layer 28. This phase has a large magnetostriction, for example on the order of 3 to $5\times10^{-7}$. A high magnetostriction adversely affect the stability of a read head (not shown) incorporating the conventional magnetic element 10. Moreover, this magnetostriction is not repeatable over different runs in the apparatus 80. Consequently, the magnetostriction in the free layer 28 may vary widely between conventional magnetic elements 10. Thus, two conventional magnetic elements 10 that are formed using the same method may have significantly different properties. Thus, conventional magnetic elements 10 manufactured using the conventional method 50 and the conventional system 80 may have undesirable magnetostriction that can vary from element to element.

Accordingly, what is needed is a method and system for improving the magnetostriction of magnetic elements. The present invention addresses such a need.

BRIEF SUMMARY OF THE INVENTION

The present invention provides a method and system for providing a magnetic element. The method and system comprise providing a pinned layer, fabricating a metallic spacer layer and oxidizing a portion of the spacer layer in an environment including at least oxygen and a gas inert with respect to the spacer layer to provide an oxide layer. The method and system also comprise creating a free layer. The oxide layer is between a remaining metallic portion of the spacer layer and the free layer. In one aspect, the system comprises a chamber and a gas diffusion apparatus within the chamber. The gas diffusion apparatus includes a plurality of nozzles and defines a plane. The gas exits each of the plurality of nozzles in a cone having an apex angle. The nozzles are directed at a nozzle tilt angle of at least half of the apex angle from the plane and the spacer layer. In another aspect, the system comprises a gas diffusion means that defines an indirect path to the magnetic element According to the method and system disclosed herein, a magnetic element can be fabricated to have repeatably reduced magnetostriction.

DETAILED DESCRIPTION OF THE INVENTION

Figure 4:
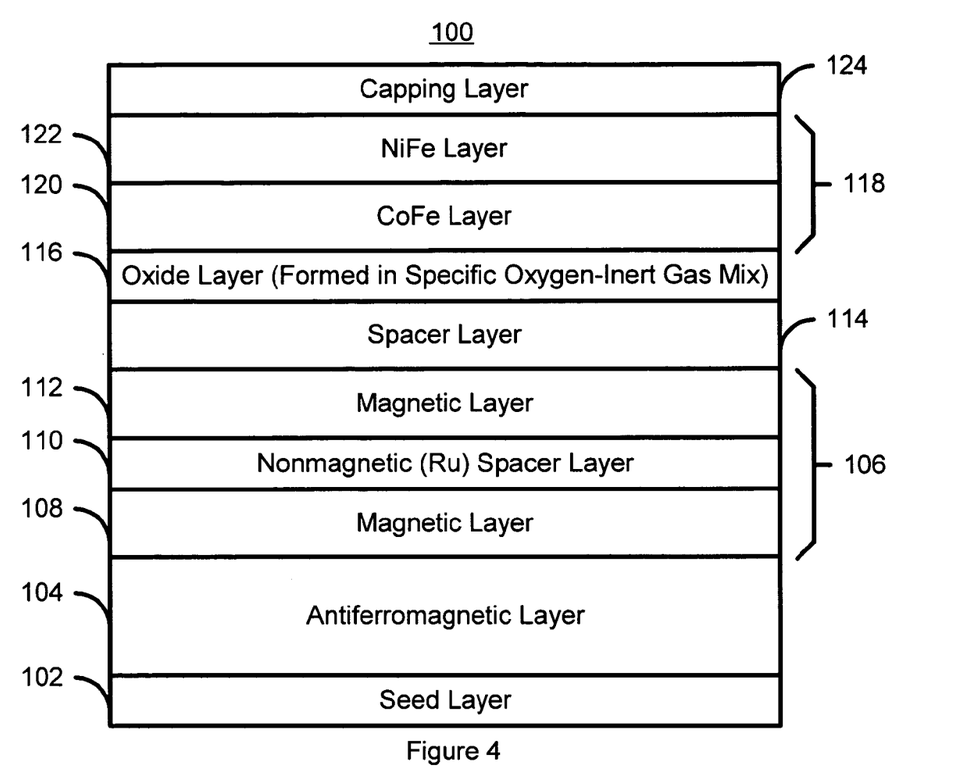
FIG. 4 is a diagram of one embodiment of a magnetic element in accordance with an embodiment of the present invention.

FIG. 4 depicts a diagram of a magnetic element 100 in accordance with one enabling and exemplary embodiment of the present invention. The magnetic element includes at least a pinned layer 106, a spacer layer 114, an oxide layer 116, and a free layer 118. The pinned layer 106 is preferably a synthetic pinned layer including ferromagnetic layers 108 and 112 separated by a conductive, nonmagnetic spacer layer 110. The nonmagnetic spacer layer 110 is preferably composed of Ru and has a thickness that is configured such that the magnetizations of the ferromagnetic layers 108 and 112 are antiferromagnetically aligned. The free layer 118 is preferably a bilayer including a CoFe layer 120 and a NiFe layer 122. The spacer layer 114 is a conductor, is nonmagnetic, and preferably comprised of Cu. The oxide layer 116 is an oxide of the same conductor used in forming the spacer layer 114. Furthermore, the oxide layer 116 is formed as described below, by oxidizing a portion of the conductor in an environment including a mixture of oxygen and a gas that is inert with respect to the conductor used in forming the spacer layer 114. In a preferred embodiment, the oxygen and gas are premixed and are introduced through a gas diffusion apparatus, described below. The magnetic element 100 also preferably includes a seed layer 102 and an AFM layer 104 that is used in pinning the magnetization of the pinned layer 106. The magnetic element 100 also includes a capping layer 124.

Figure 5:
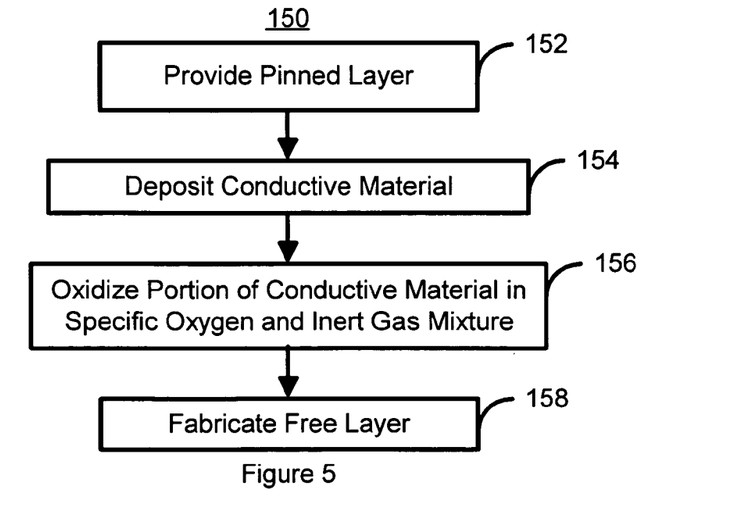
FIG. 5 is a high-level flow chart in accordance with an embodiment of the present invention.

FIG. 5 is a high-level flow chart 150 for fabricating at least a portion of magnetic element 100, according to one embodiment of the present invention. Referring to FIGS. 4 and 5, the pinned layer 106 is provided, via step 152. In one embodiment, step 152 includes providing the first ferromagnetic layer 108, the conductive nonmagnetic spacer layer 110, and the second ferromagnetic layer 112. The conductive material for the spacer layer 114 is deposited, via step 154. A portion of the conductive material is oxidized in an environment including oxygen and at least one gas inert with respect to the conductive material used in the spacer layer 114, via step 156. Thus, the oxide layer 116 is formed. In a preferred embodiment, only one gas, preferably argon, is mixed with the oxygen. In one embodiment, less than three percent of oxygen is mixed with the gas. In a preferred embodiment, between one half and one and a half percent oxygen is mixed with the gas. In a preferred embodiment, step 156 includes premixing the gas and the oxygen before it is introduced the region surrounding the conductive material. The oxygen and gas can be introduced via an indirect path to the magnetic element 100 being formed. In such an embodiment, the oxygen and gas may be introduced using the gas diffusion apparatus described below. In one embodiment, the flow of the gas and oxygen are also controlled so that any artifacts in the magnetic element 100 of the flow of gas coming from a particular direction are reduced or eliminated. Moreover, the flow rate of oxygen and gas is preferably controlled to have a desired value. The free layer 118 is created, via step 158. Step 158 preferably includes forming the CoFe layer 120 and the NiFe layer 122.

Exemplary magnetic element 100 can exhibit reduced magnetostriction. In particular, magnetostriction of near zero, or slightly negative can be achieved by controlling the flow rate of the premixture of oxygen and the gas and the oxidation time for the oxide layer 116. Furthermore, the higher output signal and the soft magnetic properties of the magnetic element 100 can be maintained through the use of the oxide layer 116 and the free layer 118 including a CoFe layer 120 and a NiFe layer 122.

Figure 6:
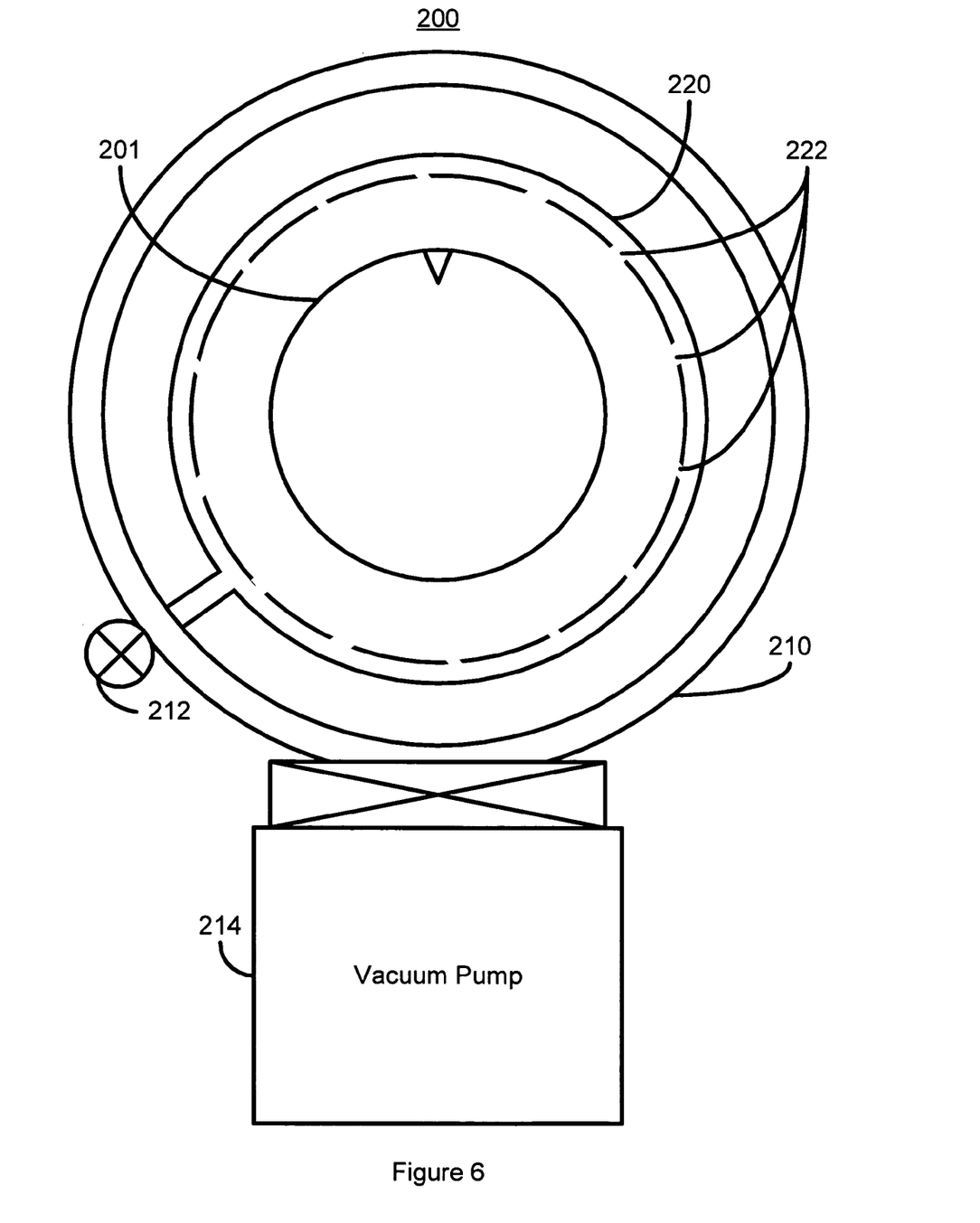
FIG. 6 depicts a top view of a system in accordance with an embodiment of the present invention.
Figure 7:
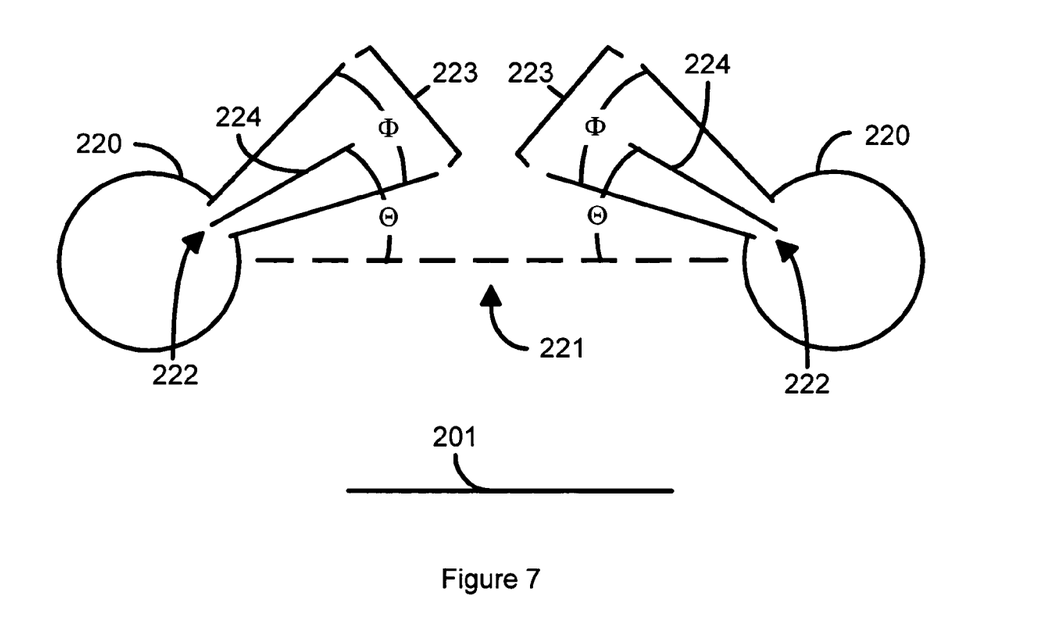
FIG. 7 depicts a cross-sectional view of a system in accordance with an embodiment of the present invention.

FIGS. 6 and 7 depict top and side, sectional views of a system 200 in accordance with an exemplary embodiment of the present invention for performing at least a portion of the method 150. The system 200 includes a chamber 210 that is preferably a vacuum chamber, a gas inlet 212, a pump 214, and a gas diffusion apparatus 220. The gas diffusion apparatus 220 has a number of nozzles 222 that are preferably simple holes. Also depicted is a wafer 201 on which multiple magnetic elements 100 are fabricated. The gas diffusion apparatus 220 is depicted in this exemplary embodiment as a ring. However, the gas diffusion apparatus 220 might have another shape depending on various factors including the shape of the chamber 210 and the placement of the substrate 201 with respect to the gas diffusion apparatus 220.

In the embodiment of FIGS. 6 and 7, the diffusion apparatus 220 is located around the wafer 201. The nozzles 222 are preferably configured to define an indirect path for the gas and oxygen from the gas diffusion apparatus 220 to the spacer layer 116 on the wafer 201. Molecules of oxygen and the gas leaving the gas diffusion apparatus 220 are generally ballistic in nature, traveling in a substantially straight path until undergoing a collision with other molecules, the chamber 210 or another solid body. In one embodiment, the nozzles are angled such that the gas and oxygen exiting the gas diffusion apparatus are directed in a line that is not towards the wafer 201. Stated differently, the nozzles are configured such that gas exiting the apparatus is directed along an indirect path to the wafer. In such an embodiment, the gas leaving the nozzles 222 is generally confined to the cone 223 depicted in FIG. 7. The apex angle of the cone is Φ. For the embodiment depicted in FIGS. 6 and 7, the gas diffusion apparatus 220 generally defines a plane 221. According to one embodiment, the nozzles 222 are directed away from this plane by a nozzle tilt angle, Θ. This nozzle tilt angle has a minimum value of one half of the apex angle of the cone (Φ/2). Such a nozzle tilt angle ensures that the gas molecules are not directed towards the wafer 201. If the gas diffusion apparatus 220 embodies a ring having simple holes 222 that are located around the ring, the normal 224 to the surface of the hole 222 may be directed at the nozzle tilt angle of at least Φ/2 from the plane of the ring, as shown in FIG. 7. Also in such an embodiment, the ring can have a diameter of approximately ten millimeters, while the holes 222 can have a diameter of less than one millimeter. Thus, in this embodiment the gas exiting the holes 222 travels in a direction that is not directly toward the spacer layer 116 on the wafer 201.

Figure 8:
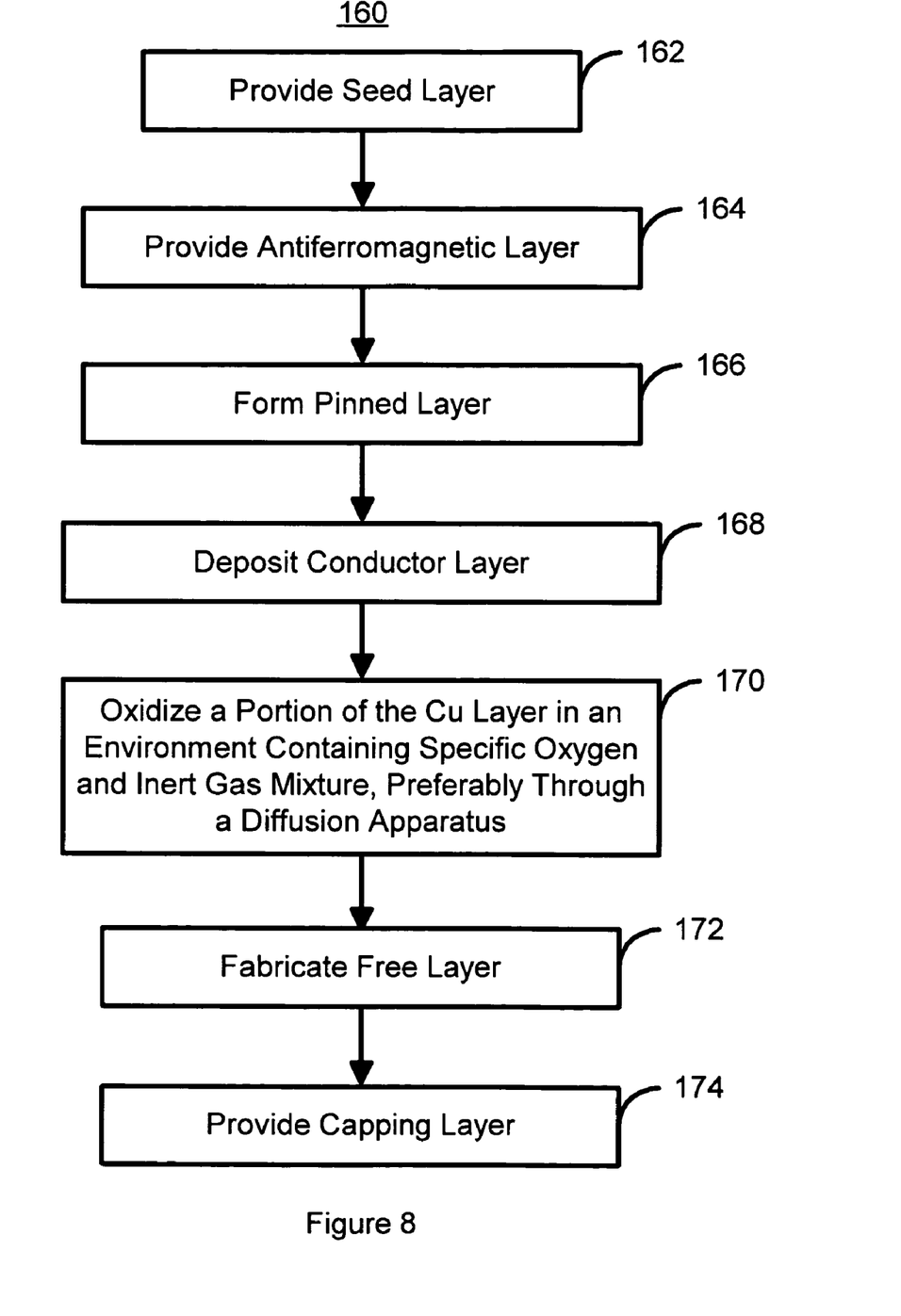
FIG. 8 is a more detailed flow chart in accordance with an embodiment of the present invention.

FIG. 8 is a more detailed flow chart of a method 160 that accords with one embodiment of the present invention. The method 160 is described in the context of the system 200 and the magnetic element 100 depicted in FIGS. 5, 6, and 7. Referring to FIGS. 5, 6, 7, and 8, the seed layer 102 and AFM layer 104 are provided on the wafer 201, via step 162 and 164, respectively. The pinned layer 106 is formed via step 166. Step 166 preferably includes depositing the ferromagnetic layers 108 and 112 as well as the conductive, nonmagnetic spacer layer 110. The spacer layer 114 and the conventional oxide layer 116 are fabricated by first depositing a conductor, preferably Cu, via step 168. The Cu is oxidized in an environment containing oxygen and at least one gas that is inert with respect to the conductor, via step 170. Preferably, argon gas is used. In addition, the argon and oxygen are preferably premixed. In one embodiment, the mixture includes not more than three percent of oxygen. In a preferred embodiment, not less than one-half and not more than one and one half percent oxygen is used with the gas. Moreover, the gas and the oxygen are preferably introduced using a gas diffusion apparatus such as the gas diffusion apparatus 220. In a preferred embodiment, the flow rate of oxygen and the gas into the chamber 210 as well as well as the oxidation time are controlled so that the magnetostriction of the magnetic element 100 is close to zero and slightly negative. As a result of the oxidation in step 170, the oxide layer 116 is formed. The free layer 118 is fabricated via step 172. In a preferred embodiment, the step 172 includes providing both the CoFe layer 120 and the NiFe layer 122. The capping layer 124 is provided via step 174.

Magnetostriction of near zero, or slightly negative can be achieved by controlling the flow rate of the premixture of oxygen and the gas and the oxidation time for the oxide layer 116. At the same time, the higher output signal and the soft magnetic properties of the magnetic element 100 can be maintained through the use of the oxide layer 116 and the free layer 118 including a CoFe layer 120 and a NiFe layer 122.

Figure 9:
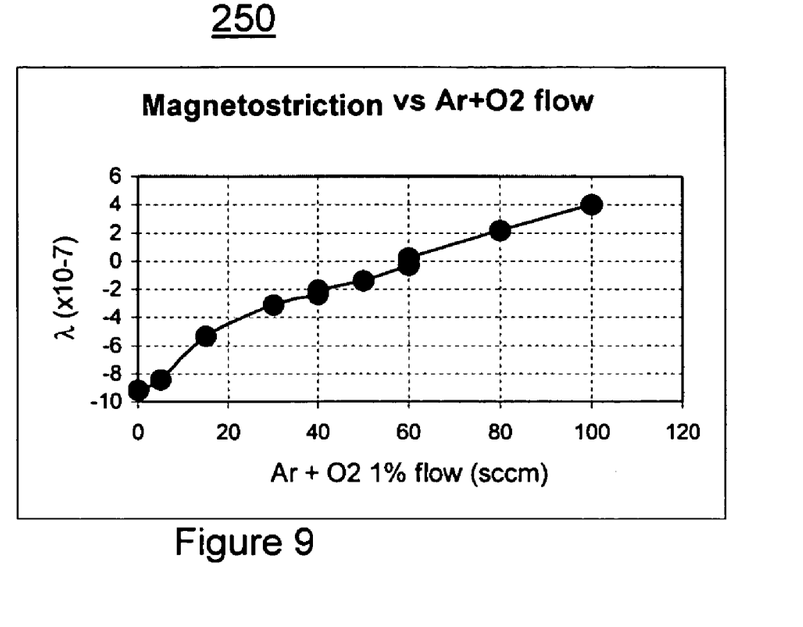
FIG. 9 is a graph depicting magnetostriction versus flow rate for a magnetic element formed in accordance with one embodiment of the present invention.
Figure 10:
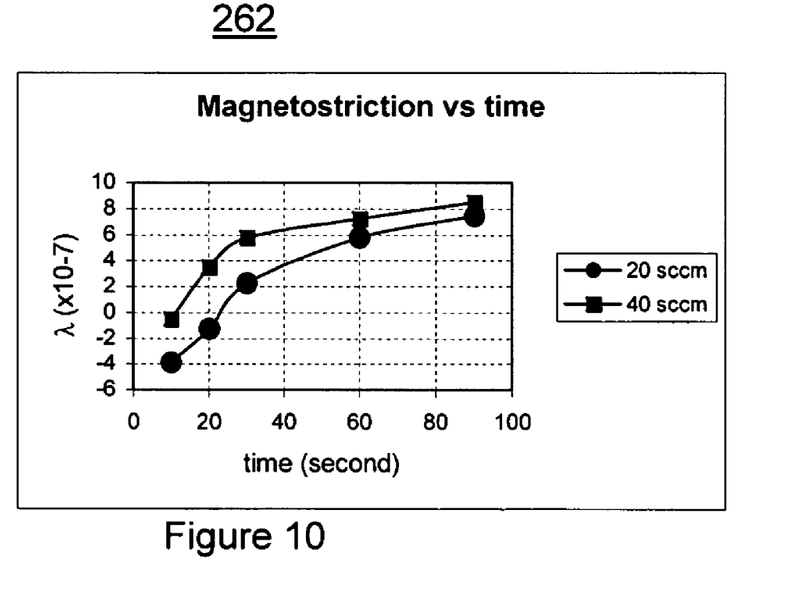
FIG. 10 is a graph depicting magnetostriction versus oxidation time a magnetic element formed according to one embodiment of the present invention.
Figure 11:
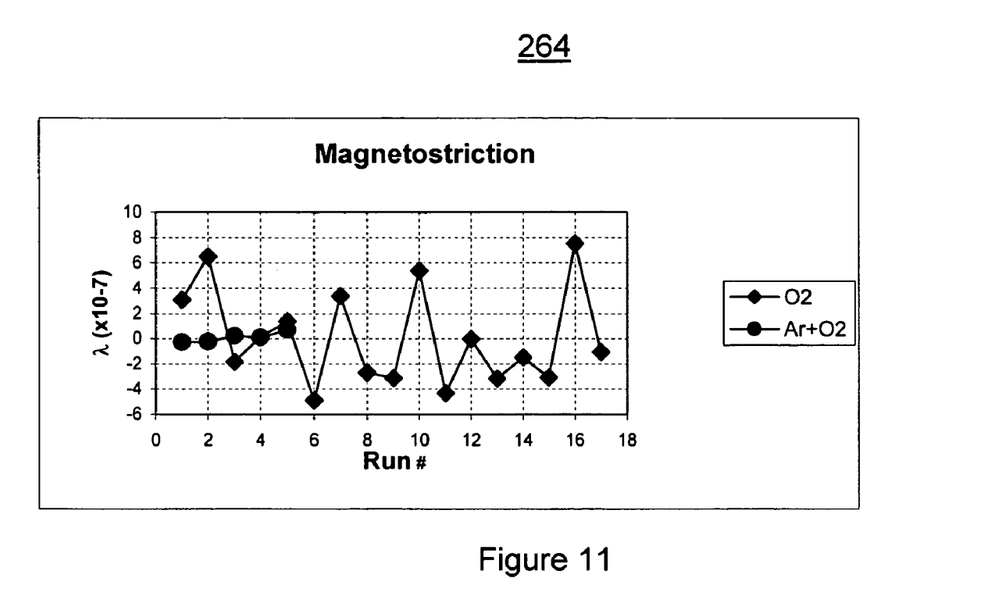
FIG. 11 is a graph depicting magnetostriction versus run number for a magnetic element formed according to one embodiment of the present invention.

Examples of the improvements achieved using the method 150 or 160 and system 200 in accordance with an embodiment of the present invention can be seen in FIGS. 9-11. FIGS. 9-11 are graphs depicting the improved magnetostrictive properties of one embodiment of the magnetic element 100. FIG. 9 is a graph 250 depicting the magnetostriction vs. flow for one embodiment of a magnetic element 100 having an oxide layer 116 formed using a mixture of argon gas with one percent of oxygen gas. As can be seen, for a flow of between about forty and sixty sccm, the magnetic element 100 has a very low magnetostriction. FIG. 10 is a graph 252 depicts the magnetostriction versus oxidation time for two flows, twenty sccm and forty sccm, used in forming one embodiment of a magnetic element 100 in accordance with the present invention. As can be determined from the graph 252, the magnetostriction can be controlled by controlling a combination of the oxidation time and the flow rate of the oxygen and argon gas premixture. FIG. 11 is a graph 264 depicting the magnetostriction versus the run number for both conventional magnetic elements 10 formed using the conventional method 50 and for the magnetic elements 100 made in accordance with an embodiment of the present invention formed using the method 150 or 160 and the system 200. As can be seen from the graph 264, the low magnetostriction is consistently repeated for multiple runs. This is in contrast to magnetic elements 10 formed using the conventional method 50, for which the magnetostriction varies widely. Thus, using the novel methods 150 and 160 and the novel system 200, the magnetostriction can be lowered in a repeatable fashion.

We claim:

1. A method for manufacturing a magnetoresistive element comprising:
    providing a pinned layer;
    fabricating a spacer layer, the spacer layer being metallic;
    oxidizing a portion of the spacer layer in an environment including at least oxygen and a gas inert with respect to the spacer layer to provide an oxide layer, the oxidizing further including providing the at least the oxygen such that the at least the oxygen takes an indirect path from entering the environment to the spacer layer;
    creating a free layer, the oxide layer between a remaining metallic portion of the spacer layer and the free layer.

2. The method of claim 1 wherein the oxygen and the gas are premixed.

3. The method of claim 1 wherein the gas consists essentially of Ar.

4. The method of claim 3 wherein the environment includes less than or equal to three percent oxygen.

5. The method of claim 4 wherein the environment includes between one half and one and one half percent oxygen.

6. The method of claim 1 wherein the spacer layer includes Cu.

7. The method of claim 1 wherein creating further includes:
    forming the free layer including at least one of CoFe and NiFe.

8. The method of claim 1 wherein providing the pinned layer further includes forming a synthetic pinned layer.

9. The method of claim 1 wherein providing the free layer further includes forming a synthetic free layer.

10. The method of claim 1 wherein oxidizing further includes:
    passing the oxygen and the gas through a gas diffusion apparatus including a plurality of nozzles, the plurality of nozzles being directed such that the gas exits each of the plurality of nozzles is in a direction that is not directly toward the spacer layer.

11. The method of claim 10 wherein the gas exits each of the plurality of nozzles in a cone having an apex angle, wherein the gas diffusion apparatus defines a plane, and wherein the plurality of nozzles are directed at a nozzle tilt angle of at least half of the apex angle from the plane and away from the spacer layer.

12. The method of claim 10 wherein the plurality of nozzles are a plurality of holes.

13. The method of claim 1 wherein oxidizing further includes:
    passing the oxygen and the gas through a gas diffusion means, the gas diffusion means defining the indirect path to the spacer layer.

14. A method for manufacturing a magnetoresistive element comprising:
    providing a pinned layer;
    forming a spacer layer, the spacer layer being metallic;
    oxidizing a portion of the spacer layer in an environment including at least oxygen to provide an oxide layer, the at least the oxygen being provided through a gas diffusion apparatus including a plurality of nozzles, the gas exiting the plurality of nozzles in a cone having an apex angle, the gas diffusion apparatus defining a plane, the plurality of nozzles being directed at a nozzle tilt angle of at least half of the apex angle from the plane and the spacer layer the plane residing between the spacer layer and the cone; and
    fabricating a free layer, the oxide layer between a remaining metallic portion of the spacer layer and the free layer.

15. The method of claim 1 wherein the providing at least the oxygen further includes:
    providing the at least the oxygen such that the at least the oxygen undergoes at least one collision before reaching the spacer layer.

* * * * *